United States Patent
Zeine et al.

(10) Patent No.: US 10,122,221 B2
(45) Date of Patent: Nov. 6, 2018

(54) TECHNIQUES FOR SELECTIVELY POWERING DEVICES IN WIRELESS POWER DELIVERY ENVIRONMENTS

(71) Applicant: Ossia Inc., Bellevue, WA (US)

(72) Inventors: Hatem Zeine, Bellevue, WA (US); Dale Mayes, Bothell, WA (US)

(73) Assignee: Ossia Inc., Bellevue, WA (US)

( * ) Notice: Subject to any disclaimer, the term of this patent is extended or adjusted under 35 U.S.C. 154(b) by 56 days.

(21) Appl. No.: 15/175,788

(22) Filed: Jun. 7, 2016

(65) Prior Publication Data

US 2016/0359379 A1    Dec. 8, 2016

Related U.S. Application Data

(60) Provisional application No. 62/172,752, filed on Jun. 8, 2015.

(51) Int. Cl.
| | | |
|---|---|---|
| *H01F 38/00* | (2006.01) | |
| *H02J 50/80* | (2016.01) | |
| *H02J 7/02* | (2016.01) | |
| *H02J 50/20* | (2016.01) | |
| *H02J 50/40* | (2016.01) | |

(Continued)

(52) U.S. Cl.
CPC ...... *H02J 50/80* (2016.02); *G01R 31/318566* (2013.01); *G01R 31/40* (2013.01); *H02J 7/0004* (2013.01); *H02J 7/025* (2013.01); *H02J 7/045* (2013.01); *H02J 50/20* (2016.02); *H02J 50/40* (2016.02); *H04L 12/6418* (2013.01); *H04W 4/12* (2013.01); *H04L 12/2818* (2013.01); *H04L 67/12* (2013.01); *H04L 2012/2841* (2013.01); *H04W 8/005* (2013.01); *H04W 52/0212* (2013.01)

(58) Field of Classification Search
CPC .. H02J 50/80; H02J 50/20; H02J 7/025; H02J 7/045
USPC .......................................................... 307/104
See application file for complete search history.

(56) References Cited

U.S. PATENT DOCUMENTS

| | | |
|---|---|---|
| 7,889,777 B2 | 2/2011 | Ruijter |
| 2010/0033021 A1* | 2/2010 | Bennett .................. H02J 17/00 307/104 |

(Continued)

FOREIGN PATENT DOCUMENTS

| | | |
|---|---|---|
| WO | 2010118075 A2 | 10/2010 |
| WO | 2014106390 A1 | 7/2014 |

OTHER PUBLICATIONS

Notification of Transmittal of the International Search Report and the Written Opinion of the International Searching Authority, or the Declaration received in International Application No. PCT/US2016/36411 dated Sep. 2, 2016, 14 pages.

(Continued)

*Primary Examiner* — Alfonso Perez Borroto

(57) ABSTRACT

Techniques are described herein for determining which power receiver clients are within a set network and limiting power transmission to these select clients. Ignoring some power requests frees up the wireless power transmission system to preferentially supply power to wireless power receiver clients that are determined to be of higher importance. This may be particularly beneficial within a home or business setting where the wireless power transmission system coverage region extends into locations where unknown devices are located.

20 Claims, 13 Drawing Sheets

(51) Int. Cl.
    *G01R 31/3185*     (2006.01)
    *G01R 31/40*     (2014.01)
    *H04W 4/12*     (2009.01)
    *H02J 7/04*     (2006.01)
    *H04L 12/64*     (2006.01)
    *H02J 7/00*     (2006.01)
    *H04W 52/02*     (2009.01)
    *H04L 12/28*     (2006.01)
    *H04L 29/08*     (2006.01)
    *H04W 8/00*     (2009.01)

(56) References Cited

U.S. PATENT DOCUMENTS

| | | | |
|---|---|---|---|
| 2010/0201202 A1 | 8/2010 | Kirby et al. | |
| 2010/0201533 A1 | 8/2010 | Kirby et al. | |
| 2011/0270452 A1* | 11/2011 | Lu | G05B 19/042 700/291 |
| 2012/0206096 A1* | 8/2012 | John | A61N 1/3785 320/108 |
| 2013/0154557 A1* | 6/2013 | Lee | H04B 5/0037 320/108 |
| 2013/0278209 A1 | 10/2013 | Von Novak, III et al. | |
| 2014/0008992 A1 | 1/2014 | Leabman | |
| 2014/0195803 A1* | 7/2014 | Knubben | H04L 9/32 713/168 |
| 2014/0285145 A1 | 9/2014 | Patro et al. | |
| 2014/0375261 A1 | 12/2014 | Manova-Elssibonye et al. | |

OTHER PUBLICATIONS

Notification of Transmittal of the International Search Report and the Written Opinion of the International Searching Authority, or the Declaration received in International Application No. PCT/US2016/036493 dated Sep. 13, 2016, 24 pages.

Notification of Transmittal of the International Search Report and the Written Opinion of the International Searching Authority, or the Declaration received in International Application No. PCT/US2016/036404 dated Sep. 15, 2016, 13 pages.

* cited by examiner

TECHNIQUES FOR SELECTIVELY POWERING DEVICES IN WIRELESS POWER DELIVERY ENVIRONMENTS

CROSS-REFERENCE TO RELATED APPLICATIONS

This application claims priority to and benefit from U.S. Provisional Patent Application Ser. No. 62/172,752 titled "SYSTEMS AND METHODS FOR IMPROVED WIRELESS POWER TRANSFERS" filed on Jun. 8, 2015, which is expressly incorporated by reference herein.

TECHNICAL FIELD

The technology described herein relates generally to the field of wireless power transmission and, more specifically, to techniques for selectively powering devices in wireless power delivery environments.

BACKGROUND

Many electronic devices are powered by batteries. Rechargeable batteries are often used to avoid the cost of replacing conventional dry-cell batteries and to conserve precious resources. However, recharging batteries with conventional rechargeable battery chargers requires access to an alternating current (AC) power outlet, which is sometimes not available or not convenient. It would, therefore, be desirable to derive power for electronics wirelessly.

Accordingly, a need exists for technology that overcomes the problem demonstrated above, as well as one that provides additional benefits. The examples provided herein of some prior or related systems and their associated limitations are intended to be illustrative and not exclusive. Other limitations of existing or prior systems will become apparent to those of skill in the art upon reading the following Detailed Description.

BRIEF DESCRIPTION OF THE DRAWINGS

One or more embodiments of the present invention are illustrated by way of example and not limitation in the figures of the accompanying drawings, in which like references indicate similar elements.

DETAILED DESCRIPTION

Figure 1:
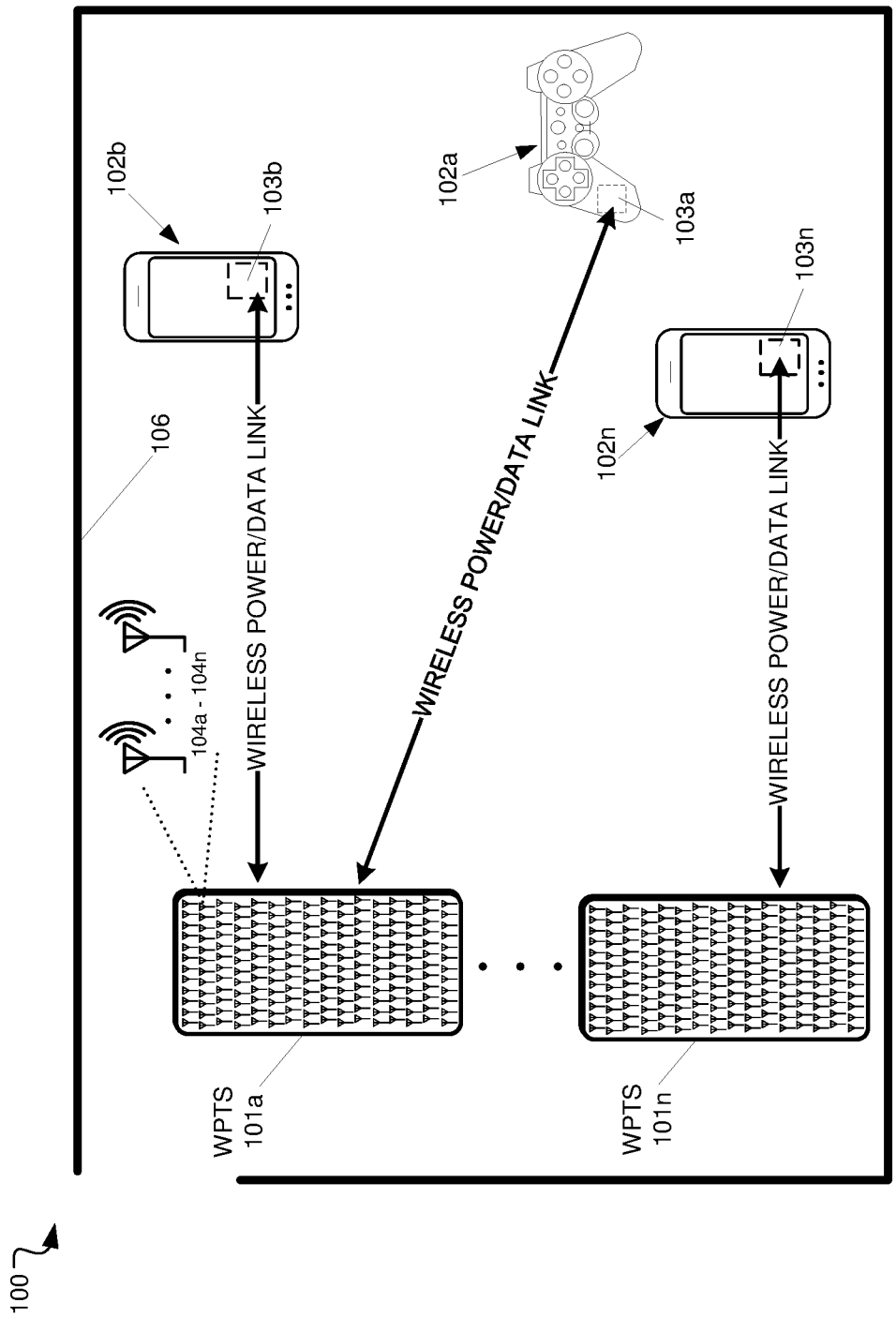
FIG. 1 depicts a block diagram including an example wireless power delivery environment illustrating wireless power delivery from one or more wireless power transmission systems to various wireless devices within the wireless power delivery environment in accordance with some embodiments.

Techniques are described herein for determining which power receiver clients are within a set network and limiting power transmission to these select clients. Ignoring some power requests frees up the wireless power transmission system to preferentially supply power to wireless power receiver clients that are determined to be of higher importance. This may be particularly beneficial within a home or business setting where the wireless power transmission system coverage region extends into locations where unknown devices are located.

The following description and drawings are illustrative and are not to be construed as limiting. Numerous specific details are described to provide a thorough understanding of the disclosure. However, in certain instances, well-known or conventional details are not described in order to avoid obscuring the description. References to one or an embodiment in the present disclosure can be, but not necessarily are, references to the same embodiment; and, such references mean at least one of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but no other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and is not intended to further limit the scope and meaning of the disclosure or of any exemplified term. Likewise, the disclosure is not limited to various embodiments given in this specification.

Without intent to further limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

I. Wireless Power Transmission System Overview/Architecture

FIG. 1 depicts a block diagram including an example wireless power delivery environment 100 illustrating wireless power delivery from one or more wireless power transmission systems (WPTS) 101$a$-$n$ (also referred to as "wireless power delivery systems", "antenna array systems" and "wireless chargers") to various wireless devices 102$a$-$n$ within the wireless power delivery environment 100, according to some embodiments. More specifically, FIG. 1 illustrates an example wireless power delivery environment 100 in which wireless power and/or data can be delivered to available wireless devices 102$a$-102$n$ having one or more wireless power receiver clients 103$a$-103$n$ (also referred to herein as "clients" and "wireless power receivers"). The wireless power receiver clients are configured to receive and process wireless power from one or more wireless power transmission systems 101$a$-101$n$. Components of an example wireless power receiver client 103 are shown and discussed in greater detail with reference to FIG. 4.

As shown in the example of FIG. 1, the wireless devices 102$a$-102$n$ include mobile phone devices and a wireless game controller. However, the wireless devices 102$a$-102$n$ can be any device or system that needs power and is capable of receiving wireless power via one or more integrated power receiver clients 103$a$-103$n$. As discussed herein, the one or more integrated power receiver clients receive and process power from one or more wireless power transmission systems 101$a$-101$n$ and provide the power to the wireless devices 102$a$-102$n$ (or internal batteries of the wireless devices) for operation thereof.

Each wireless power transmission system 101 can include multiple antennas 104$a$-$n$, e.g., an antenna array including hundreds or thousands of antennas, which are capable of delivering wireless power to wireless devices 102. In some embodiments, the antennas are adaptively-phased radio frequency (RF) antennas. The wireless power transmission system 101 is capable of determining the appropriate phases with which to deliver a coherent power transmission signal to the power receiver clients 103. The array is configured to emit a signal (e.g., continuous wave or pulsed power transmission signal) from multiple antennas at a specific phase relative to each other. It is appreciated that use of the term "array" does not necessarily limit the antenna array to any specific array structure. That is, the antenna array does not need to be structured in a specific "array" form or geometry. Furthermore, as used herein he term "array" or "array system" may be used include related and peripheral circuitry for signal generation, reception and transmission, such as radios, digital logic and modems. In some embodiments, the wireless power transmission system 101 can have an embedded Wi-Fi hub for data communications via one or more antennas or transceivers.

The wireless devices 102 can include one or more receive power clients 103. As illustrated in the example of FIG. 1, power delivery antennas 104$a$-104$n$ are shown. The power delivery antennas 104$a$ are configured to provide delivery of wireless radio frequency power in the wireless power delivery environment. In some embodiments, one or more of the power delivery antennas 104$a$-104$n$ can alternatively or additionally be configured for data communications in addition to or in lieu of wireless power delivery. The one or more data communication antennas are configured to send data communications to and receive data communications from the power receiver clients 103$a$-103$n$ and/or the wireless devices 102$a$-102$n$. In some embodiments, the data communication antennas can communicate via Bluetooth™, Wi-Fi™, ZigBee™, etc. Other data communication protocols are also possible.

Each power receiver client 103$a$-103$n$ includes one or more antennas (not shown) for receiving signals from the wireless power transmission systems 101$a$-101$n$. Likewise, each wireless power transmission system 101$a$-101$n$ includes an antenna array having one or more antennas and/or sets of antennas capable of emitting continuous wave or discrete (pulse) signals at specific phases relative to each other. As discussed above, each the wireless power transmission systems 101$a$-101$n$ is capable of determining the appropriate phases for delivering the coherent signals to the power receiver clients 102$a$-102$n$. For example, in some embodiments, coherent signals can be determined by computing the complex conjugate of a received beacon (or calibration) signal at each antenna of the array such that the coherent signal is phased for delivering power to the particular power receiver client that transmitted the beacon (or calibration) signal.

Although not illustrated, each component of the environment, e.g., wireless device, wireless power transmission system, etc., can include control and synchronization mechanisms, e.g., a data communication synchronization module. The wireless power transmission systems 101$a$-101$n$ can be connected to a power source such as, for example, a power outlet or source connecting the wireless power transmission systems to a standard or primary alternating current (AC) power supply in a building. Alternatively, or additionally, one or more of the wireless power transmission systems 101$a$-101$n$ can be powered by a battery or via other mechanisms, e.g., solar cells, etc.

The power receiver clients 102$a$-102$n$ and/or the wireless power transmission systems 101$a$-101$n$ are configured to operate in a multipath wireless power delivery environment. That is, the power receiver clients 102$a$-102$n$ and the wireless power transmission systems 101$a$-101$n$ are configured to utilize reflective objects 106 such as, for example, walls or other RF reflective obstructions within range to transmit beacon (or calibration) signals and/or receive wireless power and/or data within the wireless power delivery environment. The reflective objects 106 can be utilized for a multi-directional signal communication regardless of whether a blocking object is in the line of sight between the wireless power transmission system and the power receiver client.

As described herein, each wireless device 102a-102n can be any system and/or device, and/or any combination of devices/systems that can establish a connection with another device, a server and/or other systems within the example environment 100. In some embodiments, the wireless devices 102a-102n include displays or other output functionalities to present data to a user and/or input functionalities to receive data from the user. By way of example, a wireless device 102 can be, but is not limited to, a video game controller, a server desktop, a desktop computer, a computer cluster, a mobile computing device such as a notebook, a laptop computer, a handheld computer, a mobile phone, a smart phone, a PDA, a Blackberry device, a Treo, and/or an iPhone, etc. By way of example and not limitation, the wireless device 102 can also be any wearable device such as watches, necklaces, rings or even devices embedded on or within the customer. Other examples of a wireless device 102 include, but are not limited to, safety sensors (e.g., fire or carbon monoxide), electric toothbrushes, electronic door lock/handles, electric light switch controller, electric shavers, etc.

Although not illustrated in the example of FIG. 1, the wireless power transmission system 101 and the power receiver clients 103a-103n can each include a data communication module for communication via a data channel. Alternatively, or additionally, the power receiver clients 103a-103n can direct the wireless devices 102.1-102.n to communicate with the wireless power transmission system via existing data communications modules. In some embodiments the beacon signal, which is primarily referred to herein as a continuous waveform, can alternatively or additionally take the form of a modulated signal.

Figure 2:
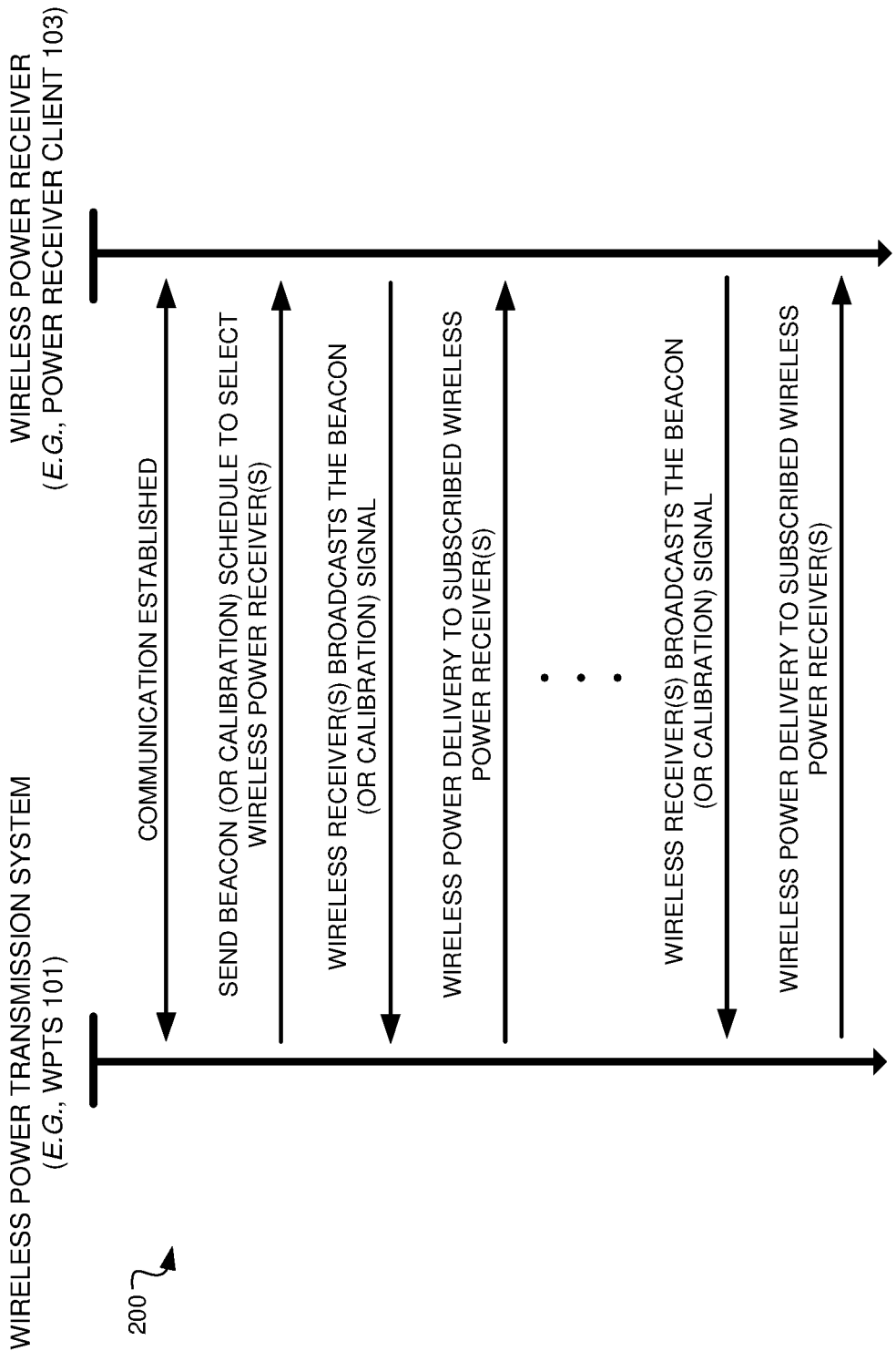
FIG. 2 depicts a sequence diagram illustrating example operations between a wireless power transmission system and a wireless receiver client for commencing wireless power delivery in accordance with some embodiments.

FIG. 2 is a sequence diagram 200 illustrating example operations between a wireless power delivery system (e.g., WPTS 101) and a wireless power receiver client (e.g., wireless power receiver client 103) for establishing wireless power delivery in a multipath wireless power delivery, according to an embodiment. Initially, communication is established between the wireless power transmission system 101 and the power receiver client 103. The initial communication can be, for example, a data communication link that is established via one or more antennas 104 of the wireless power transmission system 101. As discussed, in some embodiments, one or more of the antennas 104a-104n can be data antennas, wireless power transmission antennas, or dual-purpose data/power antennas. Various information can be exchanged between the wireless power transmission system 101 and the wireless power receiver client 103 over this data communication channel. For example, wireless power signaling can be time sliced among various clients in a wireless power delivery environment. In such cases, the wireless power transmission system 101 can send beacon schedule information, e.g., Beacon Beat Schedule (BBS) cycle, power cycle information, etc., so that the wireless power receiver client 103 knows when to transmit (broadcast) its beacon signals and when to listen for power, etc.

Continuing with the example of FIG. 2, the wireless power transmission system 101 selects one or more wireless power receiver clients for receiving power and sends the beacon schedule information to the select power receiver clients 103. The wireless power transmission system 101 can also send power transmission scheduling information so that the power receiver client 103 knows when to expect (e.g., a window of time) wireless power from the wireless power transmission system. The power receiver client 103 then generates a beacon (or calibration) signal and broadcasts the beacon during an assigned beacon transmission window (or time slice) indicated by the beacon schedule information, e.g., Beacon Beat Schedule (BBS) cycle. As discussed herein, the wireless power receiver client 103 include one or more antennas (or transceivers) which have a radiation and reception pattern in three-dimensional space proximate to the wireless device 102 in which the power receiver client 103 is embedded.

The wireless power transmission system 101 receives the beacon from the power receiver client 103 and detects and/or otherwise measures the phase (or direction) from which the beacon signal is received at multiple antennas. The wireless power transmission system 101 then delivers wireless power to the power receiver client 103 from the multiple antennas 103 based on the detected or measured phase (or direction) of the received beacon at each of the corresponding antennas. In some embodiments, the wireless power transmission system 101 determines the complex conjugate of the measured phase of the beacon and uses the complex conjugate to determine a transmit phase that configures the antennas for delivering and/or otherwise directing wireless power to the power receiver client 103 via the same path over which the beacon signal was received from the power receiver client 103.

In some embodiments, the wireless power transmission system 101 includes many antennas; one or more of which are used to deliver power to the power receiver client 103. The wireless power transmission system 101 can detect and/or otherwise determine or measure phases at which the beacon signals are received at each antenna. The large number of antennas may result in different phases of the beacon signal being received at each antenna of the wireless power transmission system 101. As discussed above, the wireless power transmission system 101 can determine the complex conjugate of the beacon signals received at each antenna. Using the complex conjugates, one or more antennas may emit a signal that takes into account the effects of the large number of antennas in the wireless power transmission system 101. In other words, the wireless power transmission system 101 can emit a wireless power transmission signal from the one or more antennas in such a way as to create an aggregate signal from the one or more of the antennas that approximately recreates the waveform of the beacon in the opposite direction. Said another way, the wireless power transmission system 101 can deliver wireless RF power to the client device via the same paths over which the beacon signal is received at the wireless power transmission system 101. These paths can utilize reflective objects 106 within the environment. Additionally, the wireless power transmission signals can be simultaneously transmitted from the wireless power transmission system 101 such that the wireless power transmission signals collectively match the antenna radiation and reception pattern of the client device in a three-dimensional (3D) space proximate to the client device.

As shown, the beacon (or calibration) signals can be periodically transmitted by power receiver clients 103 within the power delivery environment according to, for example, the BBS, so that the wireless power transmission system 101 can maintain knowledge and/or otherwise track the location of the power receiver clients 103 in the wireless power delivery environment. The process of receiving beacon signals from a wireless power receiver client at the wireless power transmission system and, in turn, responding with wireless power directed to that particular client is referred to herein as retrodirective wireless power delivery.

Furthermore, as discussed herein, wireless power can be delivered in power cycles defined by power schedule information. A more detailed example of the signaling required to commence wireless power delivery is described now with reference to FIG. 3.

Figure 3:
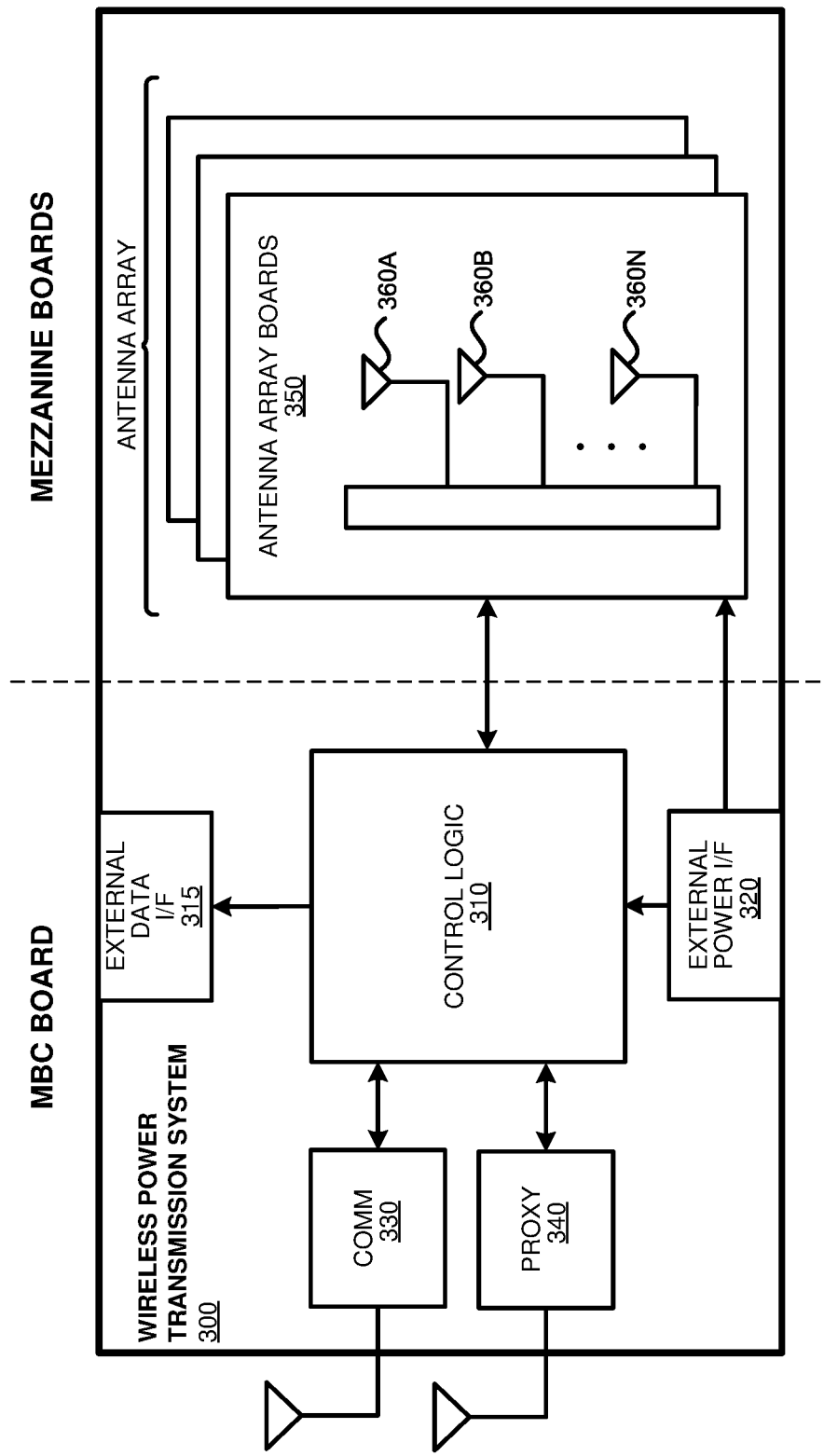
FIG. 3 depicts a block diagram illustrating example components of a wireless power transmission system in accordance with some embodiments.

FIG. 3 is a block diagram illustrating example components of a wireless power transmission system 300, in accordance with an embodiment. As illustrated in the example of FIG. 3, the wireless charger 300 includes a master bus controller (MBC) board and multiple mezzanine boards that collectively comprise the antenna array. The MBC includes control logic 310, an external data interface (I/F) 315, an external power interface (I/F) 320, a communication block 330 and proxy 340. The mezzanine (or antenna array boards 350) each include multiple antennas 360*a*-360*n*. Some or all of the components can be omitted in some embodiments. Additional components are also possible. For example, in some embodiments only one of communication block 330 or proxy 340 may be included.

The control logic 310 is configured to provide control and intelligence to the array components. The control logic 310 may comprise one or more processors, FPGAs, memory units, etc., and direct and control the various data and power communications. The communication block 330 can direct data communications on a data carrier frequency, such as the base signal clock for clock synchronization. The data communications can be Bluetooth™, Wi-Fi™, ZigBee™, etc., including combinations or variations thereof. Likewise, the proxy 340 can communicate with clients via data communications as discussed herein. The data communications can be, by way of example and not limitation, Bluetooth™, Wi-Fi™, ZigBee™, etc. Other communication protocols are possible.

In some embodiments, the control logic 310 can also facilitate and/or otherwise enable data aggregation for Internet of Things (IoT) devices. In some embodiments, wireless power receiver clients can access, track and/or otherwise obtain IoT information about the device in which the wireless power receiver client is embedded and provide that IoT information to the wireless power transmission system 300 over a data connection. This IoT information can be provided to via an external data interface 315 to a central or cloud-based system (not shown) where the data can be aggregated, processed, etc. For example, the central system can process the data to identify various trends across geographies, wireless power transmission systems, environments, devices, etc. In some embodiments, the aggregated data and or the trend data can be used to improve operation of the devices via remote updates, etc. Alternatively, or additionally, in some embodiments, the aggregated data can be provided to third party data consumers. In this manner, the wireless power transmission system acts as a Gateway or Enabler for the IoTs. By way of example and not limitation, the IoT information can include capabilities of the device in which the wireless power receiver client is embedded, usage information of the device, power levels of the device, information obtained by the device or the wireless power receiver client itself, e.g., via sensors, etc.

The external power interface 320 is configured to receive external power and provide the power to various components. In some embodiments, the external power interface 320 may be configured to receive a standard external 24 Volt power supply. In other embodiments, the external power interface 320 can be, for example, 120/240 Volt AC mains to an embedded DC power supply which sources the required 12/24/48 Volt DC to provide the power to various components. Alternatively, the external power interface could be a DC supply which sources the required 12/24/48 Volts DC. Alternative configurations are also possible.

In operation, the master bus controller (MBC), which controls the wireless power transmission system 300, receives power from a power source and is activated. The MBC then activates the proxy antenna elements on the wireless power transmission system and the proxy antenna elements enter a default "discovery" mode to identify available wireless receiver clients within range of the wireless power transmission system. When a client is found, the antenna elements on the wireless power transmission system power on, enumerate, and (optionally) calibrate.

The MBC then generates beacon transmission scheduling information and power transmission scheduling information during a scheduling process. The scheduling process includes selection of power receiver clients. For example, the MBC can select power receiver clients for power transmission and generate a Beacon Beat Schedule (BBS) cycle and a Power Schedule (PS) for the selected wireless power receiver clients. As discussed herein, the power receiver clients can be selected based on their corresponding properties and/or requirements.

In some embodiments, the MBC can also identify and/or otherwise select available clients that will have their status queried in the Client Query Table (CQT). Clients that are placed in the CQT are those on "standby", e.g., not receiving a charge. The BBS and PS are calculated based on vital information about the clients such as, for example, battery status, current activity/usage, how much longer the client has until it runs out of power, priority in terms of usage, etc.

The Proxy AE broadcasts the BBS to all clients. As discussed herein, the BBS indicates when each client should send a beacon. Likewise, the PS indicates when and to which clients the array should send power to and when clients should listen for wireless power. Each client starts broadcasting its beacon and receiving power from the array per the BBS and PS. The Proxy can concurrently query the Client Query Table to check the status of other available clients. In some embodiments, a client can only exist in the BBS or the CQT (e.g., waitlist), but not in both. The information collected in the previous step continuously and/or periodically updates the BBS cycle and/or the PS.

Figure 4:
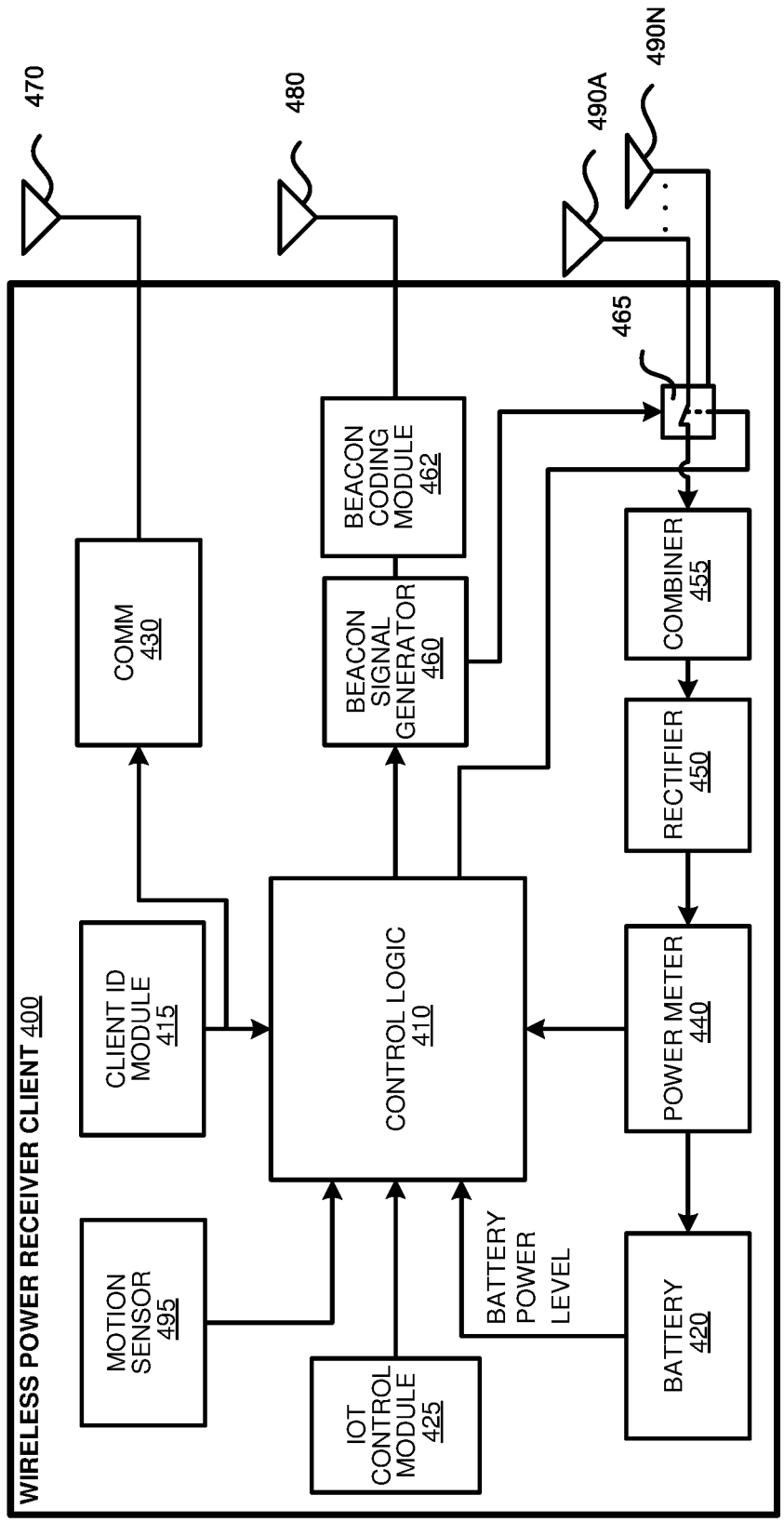
FIG. 4 depicts a block diagram illustrating example components of a wireless power receiver client in accordance with some embodiments.

FIG. 4 is a block diagram illustrating example components of a wireless power receiver client, in accordance with some embodiments. As illustrated in the example of FIG. 4, the receiver 400 includes control logic 410, battery 420, an IoT control module 425, communication block 430 and associated antenna 470, power meter 440, rectifier 450, a combiner 455, beacon signal generator 460, beacon coding unit 462 and an associated antenna 480, and switch 465 connecting the rectifier 450 or the beacon signal generator 460 to one or more associated antennas 490*a*-*n*. Some or all of the components can be omitted in some embodiments. For example, in some embodiments, the wireless power receiver client does not include its own antennas but instead utilizes and/or otherwise shares one or more antennas (e.g., Wi-Fi antenna) of the wireless device in which the wireless power receiver client is embedded. Moreover, in some embodiments, the wireless power receiver client may include a single antenna that provides data transmission functionality as well as power/data reception functionality. Additional components are also possible.

A combiner 455 receives and combines the received power transmission signals from the power transmitter in the event that the receiver 400 has more than one antenna. The combiner can be any combiner or divider circuit that is configured to achieve isolation between the output ports while maintaining a matched condition. For example, the combiner 455 can be a Wilkinson Power Divider circuit. The rectifier 450 receives the combined power transmission signal from the combiner 455, if present, which is fed through the power meter 440 to the battery 420 for charging. The power meter 440 can measure the received power signal strength and provides the control logic 410 with this measurement.

The control logic 410 can receive the battery power level from the battery 420 itself. The control logic 410 may also transmit/receive via the communication block 430 a data signal on a data carrier frequency, such as the base signal clock for clock synchronization. The beacon signal generator 460 generates the beacon signal, or calibration signal, transmits the beacon signal using either the antenna 480 or 490 after the beacon signal is encoded.

It may be noted that, although the battery 420 is shown as charged by, and providing power to, the receiver 400, the receiver may also receive its power directly from the rectifier 450. This may be in addition to the rectifier 450 providing charging current to the battery 420, or in lieu of providing charging. Also, it may be noted that the use of multiple antennas is one example of implementation and the structure may be reduced to one shared antenna.

In some embodiments, the control logic 410 and/or the IoT control module 425 can communicate with and/or otherwise derive IoT information from the device in which the wireless power receiver client 400 is embedded. Although not shown, in some embodiments, the wireless power receiver client 400 can have one or more data connections (wired or wireless) with the device in which the wireless power receiver client 400 is embedded over which IoT information can be obtained. Alternatively, or additionally, IoT information can be determined and/or inferred by the wireless power receiver client 400, e.g., via one or more sensors. As discussed above, the IoT information can include, but is not limited to, information about the capabilities of the device in which the wireless power receiver client is embedded, usage information of the device in which the wireless power receiver client is embedded, power levels of the battery or batteries of the device in which the wireless power receiver client is embedded, and/or information obtained or inferred by the device in which the wireless power receiver client is embedded or the wireless power receiver client itself, e.g., via sensors, etc.

In some embodiments, a client identifier (ID) module 415 stores a client ID that can uniquely identify the power receiver client in a wireless power delivery environment. For example, the ID can be transmitted to one or more wireless power transmission systems when communication is established. In some embodiments, power receiver clients may also be able to receive and identify other power receiver clients in a wireless power delivery environment based on the client ID.

An optional motion sensor 495 can detect motion and signal the control logic 410 to act accordingly. For example, a device receiving power may integrate motion detection mechanisms such as accelerometers or equivalent mechanisms to detect motion. Once the device detects that it is in motion, it may be assumed that it is being handled by a user, and would trigger a signal to the array to either to stop transmitting power, or to lower the power transmitted to the device. In some embodiments, when a device is used in a moving environment like a car, train or plane, the power might only be transmitted intermittently or at a reduced level unless the device is critically low on power.

Figure 5A:
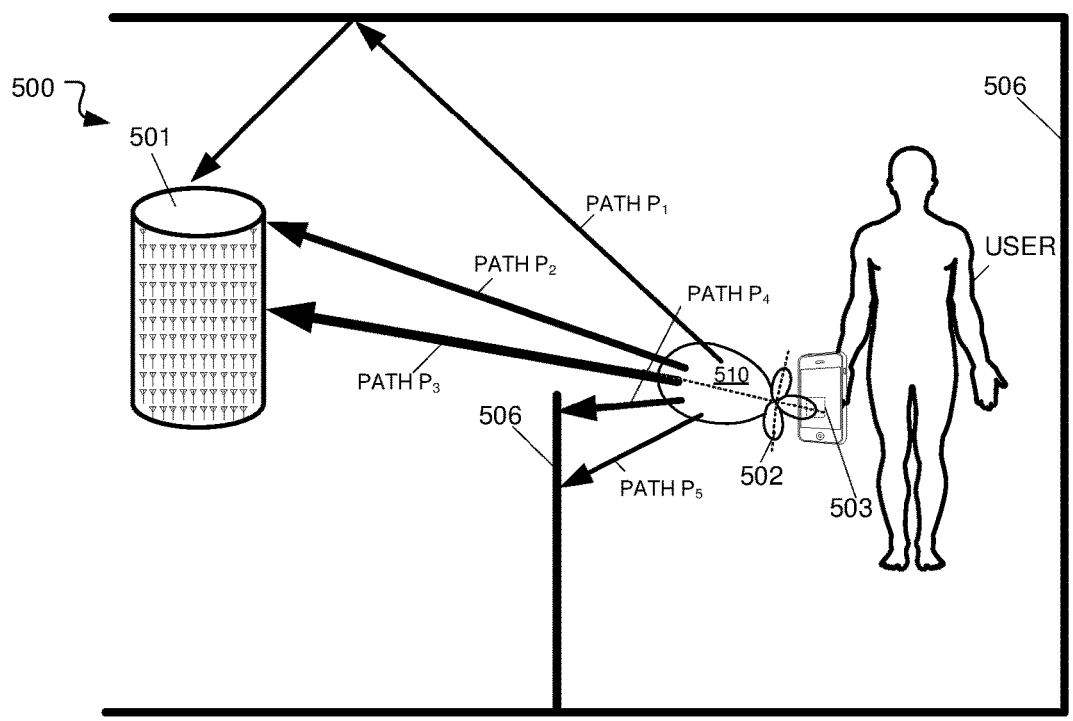
FIGS. 5A and 5B depict diagrams illustrating an example multipath wireless power delivery environment in accordance with some embodiments.
Figure 5B:
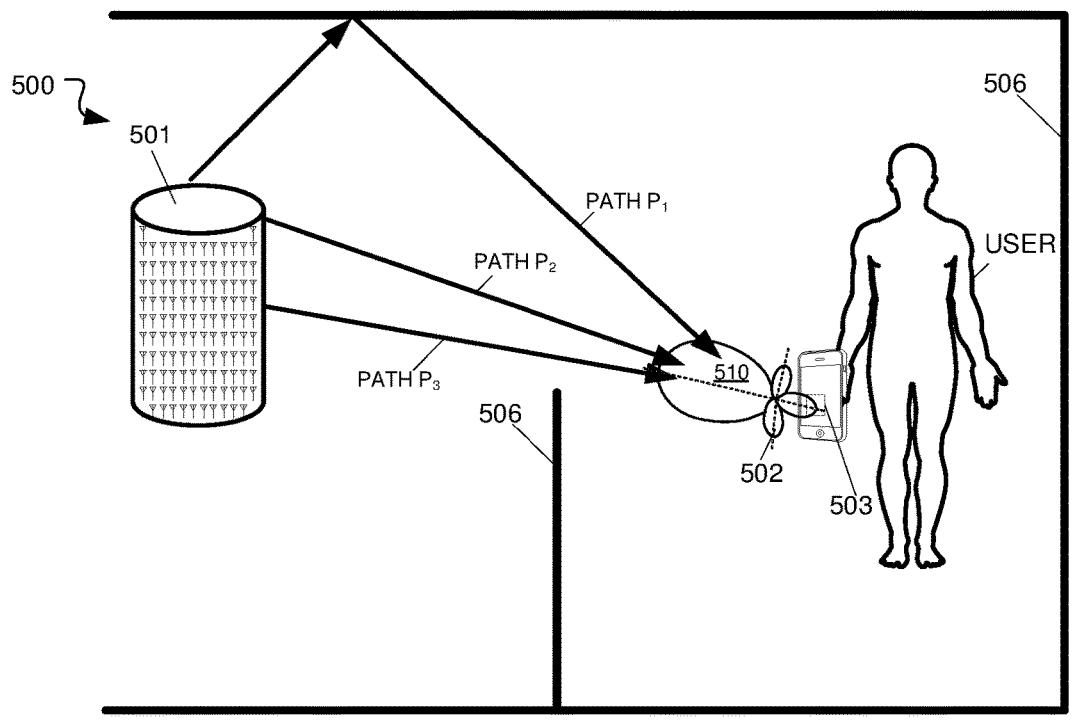

FIGS. 5A and 5B depict diagrams illustrating an example multipath wireless power delivery environment 500, according to some embodiments. The multipath wireless power delivery environment 500 includes a user operating a wireless device 502 including one or more wireless power receiver clients 503. The wireless device 502 and the one or more wireless power receiver clients 503 can be wireless device 102 of FIG. 1 and wireless power receiver client 103 of FIG. 1 or wireless power receiver client 400 of FIG. 4, respectively, although alternative configurations are possible. Likewise, wireless power transmission system 501 can be wireless power transmission system 101 FIG. 1 or wireless power transmission system 300 of FIG. 3, although alternative configurations are possible. The multipath wireless power delivery environment 500 includes reflective objects 506 and various absorptive objects, e.g., users, or humans, furniture, etc.

Wireless device 502 includes one or more antennas (or transceivers) that have a radiation and reception pattern 510 in three-dimensional space proximate to the wireless device 102. The one or more antennas (or transceivers) can be wholly or partially included as part of the wireless device 102 and/or the wireless power receiver client (not shown). For example, in some embodiments one or more antennas, e.g., Wi-Fi, Bluetooth, etc. of the wireless device 502 can be utilized and/or otherwise shared for wireless power reception. As shown in the example of FIGS. 5A and 5B, the radiation and reception pattern 510 comprises a lobe pattern with a primary lobe and multiple side lobes. Other patterns are also possible.

The wireless device 502 transmits a beacon (or calibration) signal over multiple paths to the wireless power transmission system 501. As discussed herein, the wireless device 502 transmits the beacon in the direction of the radiation and reception pattern 510 such that the strength of the received beacon signal by the wireless power transmission system, e.g., RSSI, depends on the radiation and reception pattern 510. For example, beacon signals are not transmitted where there are nulls in the radiation and reception pattern 510 and beacon signals are the strongest at the peaks in the radiation and reception pattern 510, e.g., peak of the primary lobe. As shown in the example of FIG. 5A, the wireless device 502 transmits beacon signals over five paths P1-P5. Paths P4 and P5 are blocked by reflective and/or absorptive object 506. The wireless power transmission system 501 receives beacon signals of increasing strengths via paths P1-P3. The bolder lines indicate stronger signals. In some embodiments the beacon signals are directionally transmitted in this manner to, for example, avoid unnecessary RF energy exposure to the user.

A fundamental property of antennas is that the receiving pattern (sensitivity as a function of direction) of an antenna when used for receiving is identical to the far-field radiation pattern of the antenna when used for transmitting. This is a consequence of the reciprocity theorem in electromagnetics. As shown in the example of FIGS. 5A and 5B, the radiation and reception pattern 510 is a three-dimensional lobe shape. However, the radiation and reception pattern 510 can be any number of shapes depending on the type or types, e.g., horn antennas, simple vertical antenna, etc. used in the antenna design. For example, the radiation and reception pattern 510 can comprise various directive patterns. Any number of different antenna radiation and reception patterns are possible for each of multiple client devices in a wireless power delivery environment.

Referring again to FIG. 5A, the wireless power transmission system 501 receives the beacon (or calibration) signal via multiple paths P1-P3 at multiple antennas or transceivers. As shown, paths P2 and P3 are direct line of sight paths while path P1 is a non-line of sight path. Once the beacon (or calibration) signal is received by the wireless power transmission system 501, the power transmission system 501 processes the beacon (or calibration) signal to determine one or more receive characteristics of the beacon signal at each of the multiple antennas. For example, among other operations, the wireless power transmission system 501 can measure the phases at which the beacon signal is received at each of the multiple antennas or transceivers.

The wireless power transmission system 501 processes the one or more receive characteristics of the beacon signal at each of the multiple antennas to determine or measure one or more wireless power transmit characteristics for each of the multiple RF transceivers based on the one or more receive characteristics of the beacon (or calibration) signal as measured at the corresponding antenna or transceiver. By way of example and not limitation, the wireless power transmit characteristics can include phase settings for each antenna or transceiver, transmission power settings, etc.

As discussed herein, the wireless power transmission system 501 determines the wireless power transmit characteristics such that, once the antennas or transceivers are configured, the multiple antennas or transceivers are operable to transit a wireless power signal that matches the client radiation and reception pattern in the three-dimensional space proximate to the client device. FIG. 5B illustrates the wireless power transmission system 501 transmitting wireless power via paths P1-P3 to the wireless device 502. Advantageously, as discussed herein, the wireless power signal matches the client radiation and reception pattern 510 in the three-dimensional space proximate to the client device. Said another way, the wireless power transmission system will transmit the wireless power signals in the direction in which the wireless power receiver has maximum gain, e.g., will receive the most wireless power. As a result, no signals are sent in directions in which the wireless power receiver cannot receiver, e.g., nulls and blockages. In some embodiments, the wireless power transmission system 501 measures the RSSI of the received beacon signal and if the beacon is less than a threshold value, the wireless power transmission system will not send wireless power over that path.

The three paths shown in the example of FIGS. 5A and 5B are illustrated for simplicity, it is appreciated that any number of paths can be utilized for transmitting power to the wireless device 502 depending on, among other factors, reflective and absorptive objects in the wireless power delivery environment.

II. Selectively Powering Devices

Figure 6:
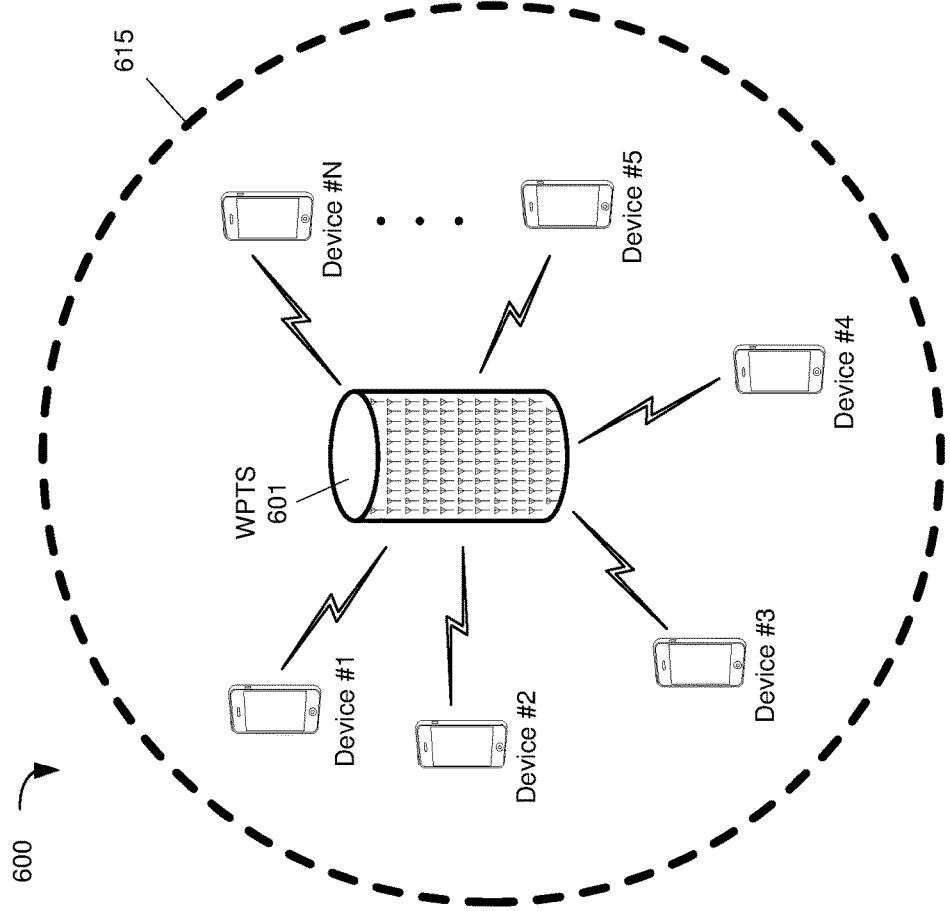
FIG. 6 depicts a diagram illustrating an example wireless power delivery environment in accordance with some embodiments.

FIG. 6 depicts a diagram illustrating an example wireless power delivery environment 600, according to some embodiments. The example wireless power delivery environment 600 includes a wireless power transmission system 601 and multiple devices 1-N located within wireless power delivery range 615 of the wireless power transmission system 601. The wireless power transmission system 601 can, among other features, selectively schedule wireless power delivery to the devices 1-N. The wireless power transmission system 601 can be wireless power transmission system 101 of FIG. 1 or wireless power transmission system 300 of FIG. 3 although alternative configurations are possible. As discussed herein, the devices 1-N can be, for example, wireless devices 102 of FIG. 1 each including one or more wireless power receiver clients. The wireless power receiver clients can be a wireless power receiver client 103 of FIG. 1 or a wireless power receiver client 400 of FIG. 4 although alternative configurations are possible.

Figure 7:
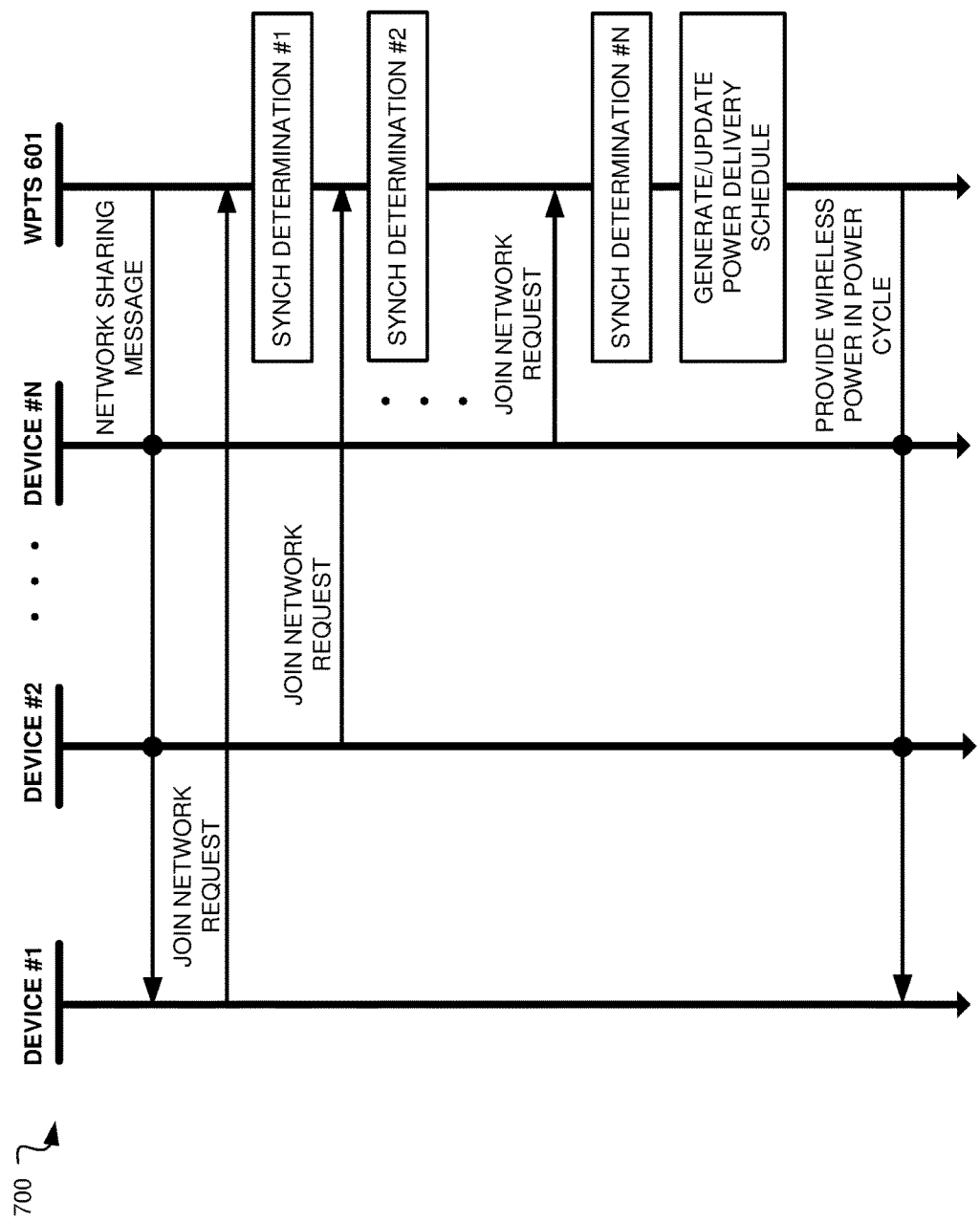
FIG. 7 depicts a sequence diagram illustrating example operations for selectively scheduling wireless power delivery to the wireless power receivers of the devices in accordance with some embodiments.

To further illustrate the operation of the wireless power transmission system 601 and the example devices 1-N, FIG. 7 is provided. FIG. 7 depicts a sequence diagram 700 illustrating example operations for selectively scheduling wireless power delivery to the wireless power receivers of the devices, according to some embodiments.

To begin, a network sharing message is broadcast by wireless power transmission system 601 to devices within range 615. The network sharing message can be, for example, a 'join my charging network' message. The wireless power receiver clients that want power can respond to the 'join my charging network' with a power consumption (or join network) request. As discussed herein, the power consumption (or join network) requests can include an ID that uniquely identifies the wireless power receiver client transmitting the request.

The wireless power transmission system receives the power consumption (or join network) requests and makes synchronization determinations for the corresponding wireless power receiver clients. For example, wireless power transmission system 601 determines if the wireless power receiver embedded in the device belongs to a set of wireless power receivers synchronized with (or known by) the wireless power transmission system for wireless power delivery. The wireless power transmission system then generates a wireless power delivery schedule for the wireless power transmission system which includes the wireless power receivers that belong to a set of wireless power receivers that are synchronized with the wireless power transmission system and provides the select devices with the schedule information.

Figure 8:
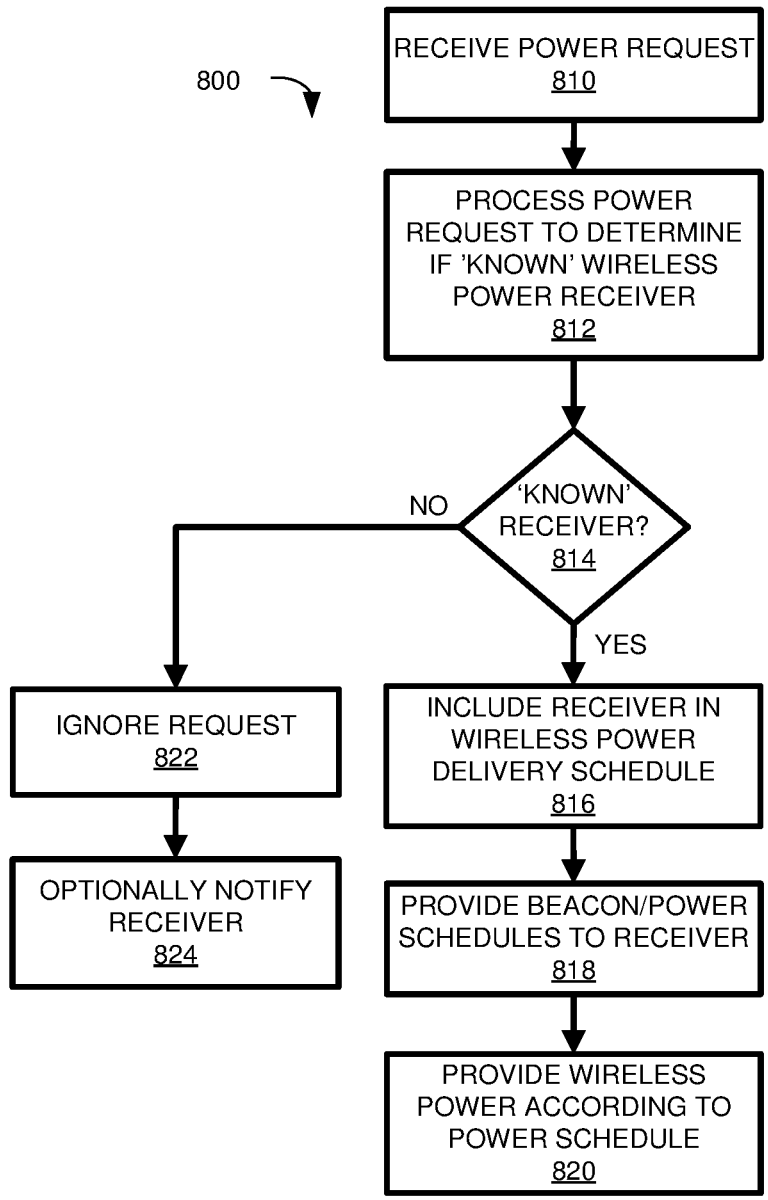
FIG. 8 depicts a flow diagram illustrating an example process for selecting wireless power receivers within or embedded in devices for closed network power transmission in accordance with some embodiments.

FIG. 8 depicts a flow diagram illustrating an example process 800 for selecting wireless power receivers within or embedded in devices for closed network power transmission, according to some embodiments. More specifically, FIG. 8 illustrates techniques for determining which wireless power receiver clients are 'known' or synchronized with the wireless power transmission system. The wireless power transmission system limits wireless power transmission to these select devices (or wireless power receiver clients). A wireless power transmission system such as, for example, wireless power transmission system 601 of FIG. 6 or wireless power transmission system 101 of FIG. 1 can, among other functions, perform example process 800.

To begin, at 810, the wireless power transmission system receives a power request (or a 'request to join network') from one or more wireless power receiver clients in the wireless power delivery environment. As discussed above, the wireless power transmission system broadcasts a network sharing message, e.g., a 'join my charging network' message. The wireless power receiver clients that want power respond to the 'join my charging network' with a power consumption (or join network) request at which point the power receiver client is given a beacon slot. The power consumption requests can include an ID that uniquely identifies the wireless power receiver client that transmitted the request. In some embodiments, the ID is transmitted by the wireless power receiver client to the wireless power transmission system when data communications between the wireless power transmission system and the device are established.

At 812, the wireless power transmission system processes the power consumption requests to determine if the wireless power receiver clients are 'known' and/or otherwise synchronized with the wireless power transmission system. For example, the wireless power transmission system can compare the IDs to a listing of known devices stored within the charger (or alternatively within a cloud based database).

At decision 814, if a receiver is 'known,' the wireless power transmission system, at 816, includes the receiver in the wireless power delivery schedule, at 818, provides a beacon and/or power schedule to the receiver, and at 820, provides retrodirective wireless power to the receiver according to the schedule and location as determined by received beacons.

However, if a receiver is unknown, at 822, the wireless power transmission system rejects or ignores the request and optionally, at 824, notifies the receiver. Ignoring requests frees up the wireless power transmission system to preferentially supply power to devices that are determined to be of higher importance. For example, the process discussed herein may be beneficial, for example, within a home or business setting where the wireless power transmission coverage region extends into locations where unknown devices are located. For example, in an apartment setting, a wireless power transmission system may be capable of supplying power to neighbor devices. The owner of the charger may desire to limit power his or her own devices.

Likewise, in a coffee shop, or other business setting, the business may desire to allow patrons to charge while shopping, but may, in exchange, require customers to register their devices (with embedded or associated wireless power receiver(s)) in order to access charging services. The registration allows a business owner to, for example, collect valuable device information regarding customers, and even target marketing materials based upon patron usage patterns and/or times they typically frequent the business.

In some embodiments, the above process of powering known devices is similar to a closed wireless router situation, whereby a password is required for a device to access the internet or network without first authenticating with the router. In a similar manner, in order for a device to become known by the charger, there must at some point be a synchronization process between the charger and the device. This could, in some embodiments, involve the inputting of a key into the device interface, which is then employed to handshake with the charger to establish a relationship. Alternatively, in some embodiments, the charger or a peripheral configuration interface may be accessed and the devices may be registered with the charger. This may simply include placing the device ID in a list of recognized devices, or may include more advanced synchronization techniques, such as certificate authentication. Likewise, in the interest of making a system that is extremely user friendly, the synchronization of the charger and device could even include the simultaneous pressing of synchronization buttons (either virtual or physical) when the charger and device are in range of one another. Additional means of synchronizing devices may likewise be employed, such as proximity of a unique RFID within a device at the time of synchronization, auto discovery and inquiry with the user, or other such methods.

Figure 9:
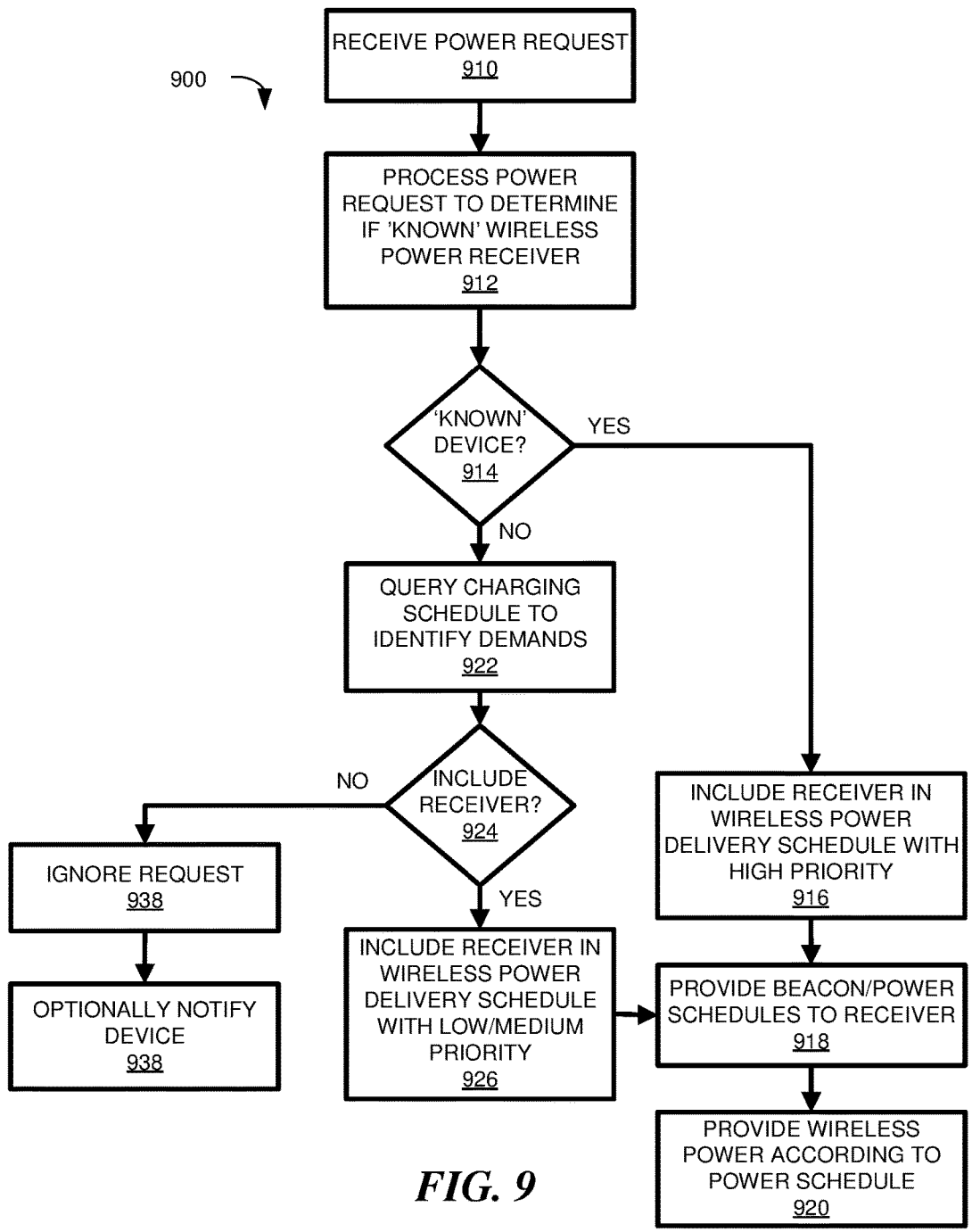
FIG. 9 depicts a flow diagram illustrating an example process for preferential charging based upon 'known' versus 'unknown' devices in accordance with some embodiments.

Referring next to FIG. 9, FIG. 9 depicts a flow diagram illustrating an example process 900 for preferential charging based upon 'known' versus 'unknown' devices, according to some embodiments. More specifically, FIG. 9 illustrates techniques similar to those discussed with reference to FIG. 8, however, rather than entirely excluding unknown devices, these devices may be provided charge on a lower (or lesser) priority level than 'known' devices. A wireless power transmission system such as, for example, wireless power transmission system 601 of FIG. 6 or wireless power transmission system 101 of FIG. 1 can, among other functions, perform example process 900.

To begin, at 910, the wireless power transmission system receives a power request (or a 'request to join network') from one or more wireless power receiver clients in the wireless power delivery environment. At 912, the wireless power transmission system processes the power consumption requests to determine if the wireless power receiver clients are 'known' and/or otherwise synchronized with the wireless power transmission system.

Figure 10:
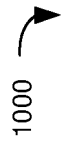
FIG. 10 depicts an example table illustrating various receivers and their associated priorities and power delivery time slots in accordance with some embodiments.

In some embodiments, the schedule includes multiple tiers of receivers. The multiple tiers can comprise at least a first tier and a second tier wherein receivers in the first tier are prioritized over receivers in the second tier by the wireless power transmission system when generating the wireless power delivery schedule. For example, at decision 914, if a receiver is 'known,' the wireless power transmission system, at 916, includes the receiver in the wireless power delivery schedule with a high priority. Example table 1000 of FIG. 10 illustrates various receivers and their associated priorities and power delivery time slots. As discussed herein, wireless power delivery schedules and beacon schedules can be time-sliced. At 918, the wireless power transmission system provides a beacon and/or power schedule to the receiver, and at 920, provides retrodirective wireless power to the receiver according to the schedule and location as determined by received beacons.

However, if a receiver is unknown, at 922, the wireless power transmission system can query and/or otherwise interrogate the wireless charging schedule to identify current charging demands At decision 924, the wireless power transmission system determines if the receiver can be added to the schedule, e.g., as a low or medium priority receiver. For example, if the power schedule is not at or near capacity with high priority devices, then the wireless power transmission system can add the receiver as a low or medium priority device. Various factors and considerations can be used to determine whether the receiver is low or medium priority.

At decision 924, if a receiver is to be included in the schedule, the wireless power transmission system, at 926, includes the receiver in the wireless power delivery schedule with a low or medium priority. The process then continues at step 918. However, if a receiver is unknown, at 938, the wireless power transmission system rejects or ignores the request and optionally, at 938, notifies the receiver.

FIG. 10 depicts an example table 1000 illustrating various receivers and their associated priorities and power delivery time slots. As discussed herein, in some embodiments, e.g., discussed with reference to FIG. 9, receivers can be added to the power delivery schedule with low or medium priority.

Figure 11:
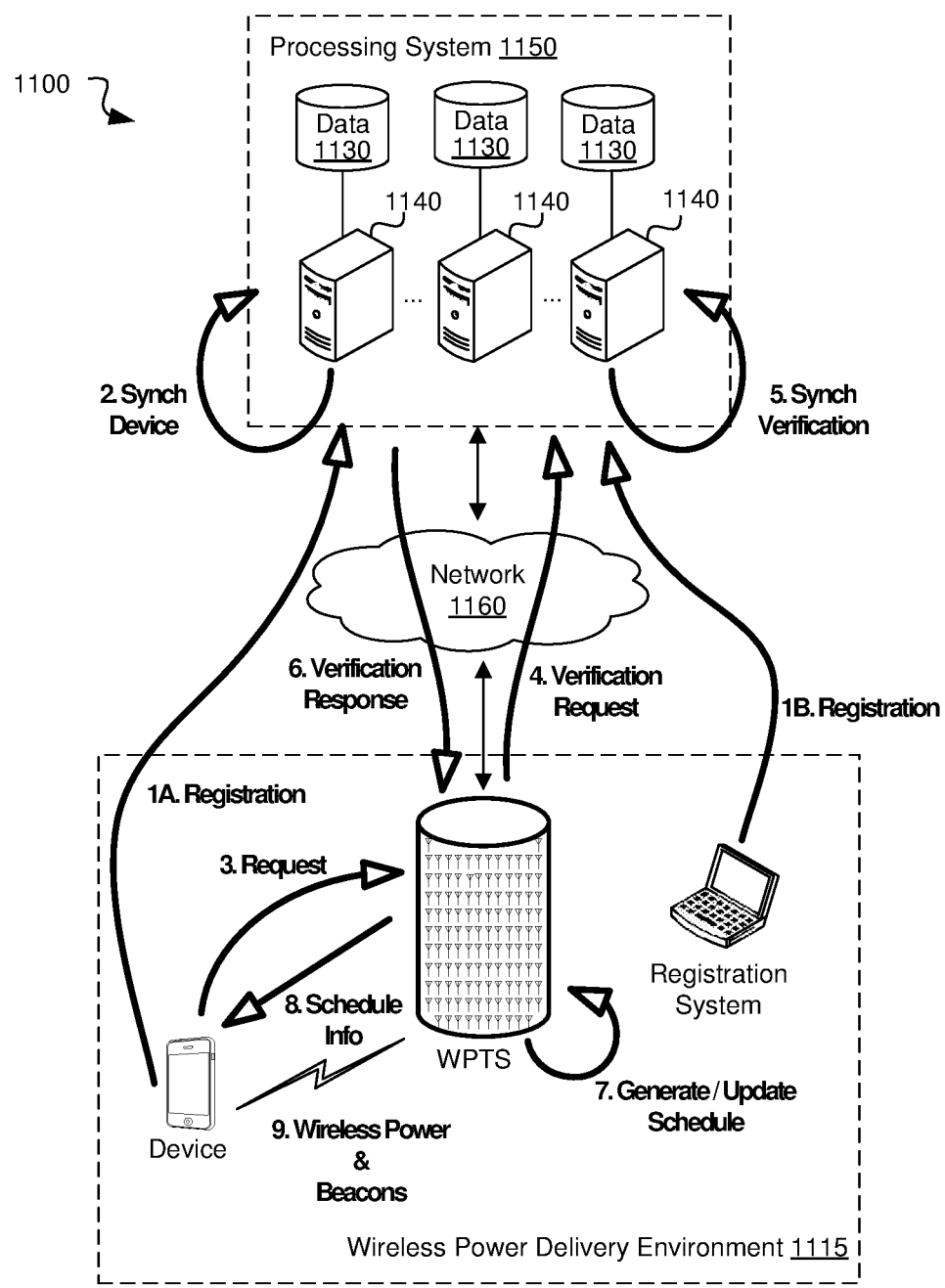
FIG. 11 depicts a diagram illustrating an example device registering for wireless power delivery and receiving wireless power in accordance with some embodiments.

FIG. 11 depicts a diagram 1100 illustrating an example device registering for wireless power delivery and receiving wireless power, according to some embodiments. More specifically, the example of FIG. 11 illustrates the device (which includes a wireless power receiver) registering for wireless power delivery via a cloud-based process system 1150 over network 1160.

To begin, at step 1A, the device registers with processing system 1150. Alternatively, at step 1B, another system, e.g., a registration system, can register the device with the processing system. In the example of FIG. 11, the processing system 1150 is configured to register devices and maintain a list of 'known' or synchronized devices. It is appreciated that some or all of the functionality of the processing system 1150 can alternatively or additionally be provided by the wireless power transmission system or a local processing system. As shown, the processing system 1150 includes multiple servers 1140 and data repositories 1130. Any number of servers 1140 and/or data repositories 1130 may be included in processing system 1150. As shown in the example of FIG. 11, the processing system 1150 can be a cloud-based or central processing system; however, it is appreciated that in some embodiments, the processing 1150 can be a local processing system, e.g., co-located with or near the wireless power transmission system(s) in the wireless power delivery environment 1115 or built into and/or otherwise combined with a wireless power transmission system.

The network 1160 can be any collection of distinct networks operating wholly or partially in conjunction to provide connectivity and may appear as one or more networks to the serviced systems and devices. For example, network 1160 can be, an open network, such as the Internet, a private network, such as an intranet and/or the extranet, and/or combinations or variations thereof. The device, wireless power transmission system and the registration system may each access network 1160 by different access networks (not shown) which are shown included within network 1160.

At step 2, the device is synchronized with the system. By way of example and without limitation, synchronization can include registering the device with the wireless power transmission system and/or the cloud-based processing system 11150, sharing credentials of the first device with the wireless power transmission system, activating a synchronization button on the device and the wireless power transmission system with a predetermined period of time of each other, or obtaining and processing information from a user of the device including payment information.

At step 3, the device requests power from the wireless power transmission system. As discussed herein, the request can be, for example, a power consumption or 'join network request.' At step 4, the wireless power transmission system generates and sends a verification request to the processing system 1150 which, in turn, at step 5 performs the synchronization verification. A verification response is transmitted to the wireless power transmission system at step 6. At step 5, the wireless power transmission system generates or updates the power transmission and/or beacon schedules based on the addition of the new device. At step 8, scheduling information is sent to the device and at step 9 wireless power and beacons are exchanged according to the schedule as discussed herein.

Figure 12:
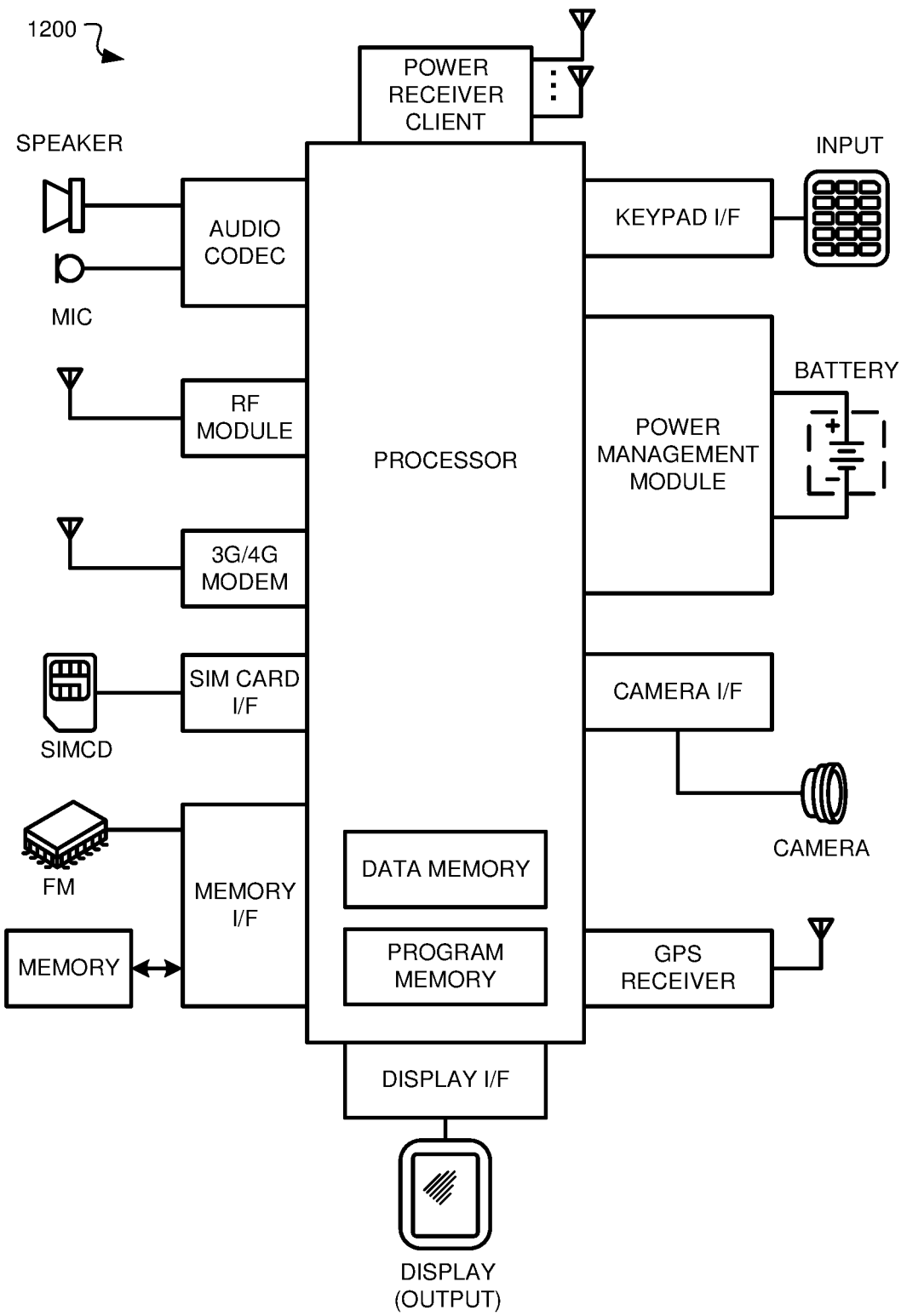
FIG. 12 depicts a block diagram illustrating example components of a representative mobile device or tablet computer with one or more wireless power receiver clients in the form of a mobile (or smart) phone or tablet computer device, according to some embodiments.

FIG. 12 depicts a block diagram illustrating example components of a representative mobile device or tablet computer 1200 with a wireless power receiver or client in the form of a mobile (or smart) phone or tablet computer device, according to an embodiment. Various interfaces and modules are shown with reference to FIG. 12, however, the mobile device or tablet computer does not require all of modules or functions for performing the functionality described herein. It is appreciated that, in many embodiments, various components are not included and/or necessary for operation of the category controller. For example, components such as GPS radios, cellular radios, and accelerometers may not be included in the controllers to reduce costs and/or complexity. Additionally, components such as ZigBee™ radios and RFID transceivers, along with antennas, can populate the Printed Circuit Board.

The wireless power receiver client can be a power receiver client 103 of FIG. 1, although alternative configurations are possible. Additionally, the wireless power receiver client can include one or more RF antennas for reception of power and/or data signals from a power transmission system, e.g., wireless power transmission system 101 of FIG. 1.

Figure 13:
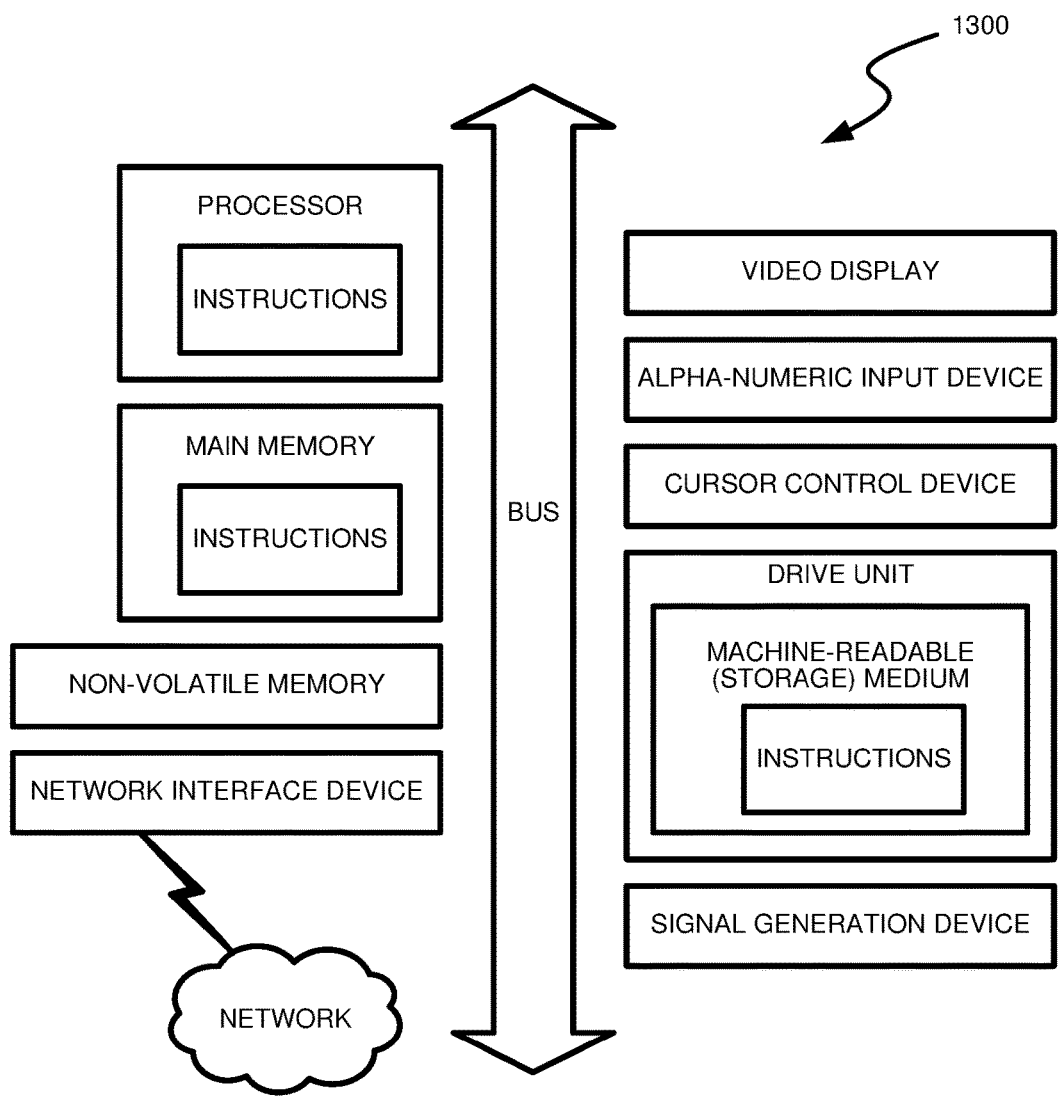
FIG. 13 depicts a diagrammatic representation of a machine, in the example form, of a computer system within which a set of instructions, for causing the machine to perform any one or more of the methodologies discussed herein, may be executed.

FIG. 13 depicts a diagrammatic representation of a machine, in the example form, of a computer system within which a set of instructions, for causing the machine to perform any one or more of the methodologies discussed herein, may be executed.

In the example of FIG. 13, the computer system includes a processor, memory, non-volatile memory, and an interface device. Various common components (e.g., cache memory) are omitted for illustrative simplicity. The computer system 1300 is intended to illustrate a hardware device on which any of the components depicted in the example of FIG. 1 (and any other components described in this specification) can be implemented. For example, the computer system can be any radiating object or antenna array system. The computer system can be of any applicable known or convenient type. The components of the computer system can be coupled together via a bus or through some other known or convenient device.

The processor may be, for example, a conventional microprocessor such as an Intel Pentium microprocessor or Motorola power PC microprocessor. One of skill in the relevant art will recognize that the terms "machine-readable (storage) medium" or "computer-readable (storage) medium" include any type of device that is accessible by the processor.

The memory is coupled to the processor by, for example, a bus. The memory can include, by way of example but not limitation, random access memory (RAM), such as dynamic RAM (DRAM) and static RAM (SRAM). The memory can be local, remote, or distributed.

The bus also couples the processor to the non-volatile memory and drive unit. The non-volatile memory is often a magnetic floppy or hard disk, a magnetic-optical disk, an optical disk, a read-only memory (ROM), such as a CD-ROM, EPROM, or EEPROM, a magnetic or optical card, or another form of storage for large amounts of data. Some of this data is often written, by a direct memory access process, into memory during execution of software in the computer 1300. The non-volatile storage can be local, remote, or distributed. The non-volatile memory is optional because systems can be created with all applicable data available in memory. A typical computer system will usually include at least a processor, memory, and a device (e.g., a bus) coupling the memory to the processor.

Software is typically stored in the non-volatile memory and/or the drive unit. Indeed, for large programs, it may not even be possible to store the entire program in the memory. Nevertheless, it should be understood that for software to run, if necessary, it is moved to a computer readable location appropriate for processing, and for illustrative purposes, that location is referred to as the memory in this paper. Even when software is moved to the memory for execution, the processor will typically make use of hardware registers to store values associated with the software, and local cache that, ideally, serves to speed up execution. As used herein, a software program is assumed to be stored at any known or convenient location (from non-volatile storage to hardware registers) when the software program is referred to as "implemented in a computer-readable medium". A processor is considered to be "configured to execute a program" when at least one value associated with the program is stored in a register readable by the processor.

The bus also couples the processor to the network interface device. The interface can include one or more of a modem or network interface. It will be appreciated that a modem or network interface can be considered to be part of the computer system. The interface can include an analog modem, isdn modem, cable modem, token ring interface, satellite transmission interface (e.g. "direct PC"), or other interfaces for coupling a computer system to other computer systems. The interface can include one or more input and/or output devices. The I/O devices can include, by way of example but not limitation, a keyboard, a mouse or other pointing device, disk drives, printers, a scanner, and other input and/or output devices, including a display device. The display device can include, by way of example but not limitation, a cathode ray tube (CRT), liquid crystal display (LCD), or some other applicable known or convenient display device. For simplicity, it is assumed that controllers of any devices not depicted in the example of FIG. 13 reside in the interface.

In operation, the computer system 1300 can be controlled by operating system software that includes a file management system, such as a disk operating system. One example of operating system software with associated file management system software is the family of operating systems known as Windows® from Microsoft Corporation of Redmond, Wash., and their associated file management systems. Another example of operating system software with its associated file management system software is the Linux operating system and its associated file management system. The file management system is typically stored in the non-volatile memory and/or drive unit and causes the processor to execute the various acts required by the operating system to input and output data and to store data in the memory, including storing files on the non-volatile memory and/or drive unit.

Some portions of the detailed description may be presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms and displays presented herein are not inherently related to any particular computer or other apparatus. Various general purpose systems may be used with programs in accordance with the teachings herein, or it may prove convenient to construct more specialized apparatus to perform the methods of some embodiments. The required structure for a variety of these systems will appear from the description below. In addition, the techniques are not described with reference to any particular programming language, and various embodiments may thus be implemented using a variety of programming languages.

In alternative embodiments, the machine operates as a standalone device or may be connected (e.g., networked) to other machines. In a networked deployment, the machine may operate in the capacity of a server or a client machine in a client-server network environment or as a peer machine in a peer-to-peer (or distributed) network environment.

The machine may be a server computer, a client computer, a personal computer (PC), a tablet PC, a laptop computer, a set-top box (STB), a personal digital assistant (PDA), a cellular telephone, an iPhone, a Blackberry, a processor, a telephone, a web appliance, a network router, switch or bridge, or any machine capable of executing a set of instructions (sequential or otherwise) that specify actions to be taken by that machine.

While the machine-readable medium or machine-readable storage medium is shown in an exemplary embodiment to be a single medium, the term "machine-readable medium" and "machine-readable storage medium" should be taken to include a single medium or multiple media (e.g., a centralized or distributed database, and/or associated caches and servers) that store the one or more sets of instructions. The term "machine-readable medium" and "machine-readable storage medium" shall also be taken to include any medium that is capable of storing, encoding or carrying a set of instructions for execution by the machine and that cause the machine to perform any one or more of the methodologies of the presently disclosed technique and innovation.

In general, the routines executed to implement the embodiments of the disclosure, may be implemented as part of an operating system or a specific application, component, program, object, module or sequence of instructions referred to as "computer programs." The computer programs typically comprise one or more instructions set at various times in various memory and storage devices in a computer, and that, when read and executed by one or more processing units or processors in a computer, cause the computer to perform operations to execute elements involving the various aspects of the disclosure.

Moreover, while embodiments have been described in the context of fully functioning computers and computer systems, those skilled in the art will appreciate that the various embodiments are capable of being distributed as a program product in a variety of forms, and that the disclosure applies equally regardless of the particular type of machine or computer-readable media used to actually effect the distribution.

Further examples of machine-readable storage media, machine-readable media, or computer-readable (storage) media include but are not limited to recordable type media such as volatile and non-volatile memory devices, floppy and other removable disks, hard disk drives, optical disks (e.g., Compact Disk Read-Only Memory (CD ROMS), Digital Versatile Disks, (DVDs), etc.), among others, and transmission type media such as digital and analog communication links.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the disclosure is not intended to be exhaustive or to limit the teachings to the precise form disclosed above. While specific embodiments of, and examples for, the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are, at times, shown as being performed in a series, these processes or blocks may instead be performed in parallel, or may be performed at different times. Further, any specific numbers noted herein are only examples: alternative implementations may employ differing values or ranges.

The teachings of the disclosure provided herein can be applied to other systems, not necessarily the system described above. The elements and acts of the various embodiments described above can be combined to provide further embodiments.

Any patents and applications and other references noted above, including any that may be listed in accompanying filing papers, are incorporated herein by reference. Aspects of the disclosure can be modified, if necessary, to employ the systems, functions, and concepts of the various references described above to provide yet further embodiments of the disclosure.

These and other changes can be made to the disclosure in light of the above Detailed Description. While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features, or aspects of the disclosure with which that terminology is associated. In general, the terms used in the following claims should not be construed to limit the disclosure to the specific embodiments disclosed in the specification, unless the above Detailed Description section explicitly defines such terms. Accordingly, the actual scope of the disclosure encompasses not only the disclosed embodiments, but also all equivalent ways of practicing or implementing the disclosure under the claims.

While certain aspects of the disclosure are presented below in certain claim forms, the inventors contemplate the various aspects of the disclosure in any number of claim forms. For example, while only one aspect of the disclosure is recited as a means-plus-function claim under 35 U.S.C. § 112, ¶ 6, other aspects may likewise be embodied as a means-plus-function claim, or in other forms, such as being embodied in a computer-readable medium. (Any claims intended to be treated under 35 U.S.C. § 112, ¶ 6 will begin with the words "means for".) Accordingly, the applicant reserves the right to add additional claims after filing the application to pursue such additional claim forms for other aspects of the disclosure.

The detailed description provided herein may be applied to other systems, not necessarily only the system described above. The elements and acts of the various examples described above can be combined to provide further implementations of the invention. Some alternative implementations of the invention may include not only additional elements to those implementations noted above, but also may include fewer elements. These and other changes can be made to the invention in light of the above Detailed Description. While the above description defines certain examples of the invention, and describes the best mode contemplated, no matter how detailed the above appears in text, the invention can be practiced in many ways. Details of the system may vary considerably in its specific implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention.

What is claimed is:

1. A method of selectively scheduling wireless power delivery in a wireless power delivery environment, the method comprising:

broadcasting, by a wireless power transmission system, a network sharing message in the wireless power delivery environment;

responsive to broadcasting the network sharing message, receiving, by the wireless power transmission system, a wireless power consumption request initiated by a first wireless power receiver in the wireless power delivery environment, wherein the wireless power consumption request uniquely identifies the first wireless power receiver;

determining that the first wireless power receiver belongs to a set of wireless power receivers synchronized with the wireless power transmission system;

generating a wireless power delivery schedule for delivering directed wireless power to multiple wireless power receivers in the wireless power delivery environment, wherein the wireless power delivery schedule is time-sliced among the multiple wireless power receivers including one or more time slots assigned to the first wireless power receiver; and delivering directed wireless power to the first wireless power receiver during the one or more time slots.

2. The method of claim 1, wherein the wireless power delivery schedule does not include the first wireless power receiver when the first wireless power receiver does not belong to the set of wireless power receivers that are synchronized with the wireless power transmission system.

3. The method of claim 1, wherein the wireless power delivery schedule includes multiple tiers of wireless power receivers.

4. The method of claim 3, wherein the multiple tiers of wireless power receivers comprise at least a first tier and a second tier, and wherein wireless power receivers in the first tier are prioritized over wireless power receivers in the second tier by the wireless power transmission system when generating the wireless power delivery schedule.

5. The method of claim 1, wherein, the first wireless power receiver is included in the wireless power delivery schedule with an associated priority.

6. The method of claim 5, wherein the priority is high when the first wireless power receiver belongs to the set of wireless power receivers that are synchronized and low when the first wireless power receiver does not belong to the set of wireless power receivers that are synchronized.

7. The method of claim 1, further comprising:
providing wireless radio frequency power to the wireless power receivers in the wireless power delivery environment that are included in the wireless power delivery schedule including the first wireless power receiver.

8. The method of claim 1, further comprising:
synchronizing the first wireless power receiver with the wireless power transmission system for wireless power delivery.

9. The method of claim 8, wherein the synchronizing the first wireless power receiver with the wireless power transmission system for wireless power delivery comprises registering the first wireless power receiver with the wireless power transmission system.

10. The method of claim 8, wherein the synchronizing the first wireless power receiver with the wireless power transmission system for wireless power delivery comprises registering the first wireless power receiver with a cloud-based system.

11. The method of claim 8, wherein the synchronizing the first wireless power receiver with the wireless power transmission system for wireless power delivery comprises sharing credentials of the first wireless power receiver with the wireless power transmission system.

12. The method of claim 8, wherein the synchronizing the first wireless power receiver with the wireless power transmission system for wireless power delivery comprises activating a synchronization button on the first wireless power receiver and the wireless power transmission system with a predetermined period of time of each other.

13. The method of claim 8, wherein the synchronizing the first wireless power receiver with the wireless power transmission system for wireless power delivery comprises obtaining information from a user of the first wireless power receiver.

14. The method of claim 8, wherein the synchronizing the first wireless power receiver with the wireless power transmission system for wireless power delivery comprises obtaining payment information.

15. A wireless power transmission system, comprising:
an adaptively-phased antenna array having multiple radio frequency (RF) transceivers;
control circuitry coupled with the adaptively-phased antenna array and configured to:
direct one or more transceivers to broadcast a network sharing message in a wireless power delivery environment;
process a wireless power consumption request initiated by a first wireless power receiver in the wireless power delivery environment, wherein the wireless power consumption request uniquely identifies the first wireless power receiver;
determine that the first wireless power receiver belongs to a set of wireless power receivers synchronized with the wireless power transmission system;
generate a wireless power delivery schedule for delivering directed wireless power to multiple wireless power receivers in the wireless power delivery environment wherein the wireless power delivery schedule is time-sliced among the multiple wireless power receivers including one or more time slots assigned to the first wireless power receiver; and
direct one or more transceivers to deliver directed wireless power to the first wireless power receiver during the one or more time slots.

16. The wireless power transmission system of claim 15, wherein the wireless power delivery schedule does not include the first wireless power receiver when the first wireless power receiver does not belong to the set of wireless power receivers that are synchronized with the wireless power transmission system.

17. The wireless power transmission system of claim 15, wherein the wireless power delivery schedule includes multiple tiers of wireless power receivers, the multiple tiers of wireless power receivers comprising at least a first tier and a second tier, and wherein wireless power receivers in the first tier are prioritized over wireless power receivers in the second tier by the wireless power transmission system when generating the wireless power delivery schedule.

18. The wireless power transmission system of claim 15, wherein the control circuitry is further configured to provide wireless radio frequency power to the wireless power receivers in the wireless power delivery environment that are included in the wireless power delivery schedule including the first wireless power receiver.

19. The wireless power transmission system of claim 15, wherein the control circuitry is further configured to synchronize the first wireless power receiver with the wireless power transmission system for wireless power delivery.

20. A non-transitory computer-readable storage medium having program instructions stored thereon which, when executed by one or more processors of a wireless power transmission system, cause the wireless power transmission system to:
broadcast a network sharing message in a wireless power delivery environment;
process a wireless power consumption request initiated by a first wireless power receiver in the wireless power delivery environment, wherein the wireless power consumption request uniquely identifies the first wireless power receiver;

determine that the first wireless power receiver belongs to a set of wireless power receivers synchronized with the wireless power transmission system; and generate a wireless power delivery schedule for delivering directed wireless power to multiple wireless power receivers in the wireless power delivery environment, wherein the wireless power delivery schedule is time-sliced among the multiple wireless power receivers including one or more time slots assigned to the first wireless power receiver;

deliver directed wireless power to the first wireless power receiver during the one or more time slots.

* * * * *